United States Patent [19]

Gaffney

[11] Patent Number: 4,866,449
[45] Date of Patent: Sep. 12, 1989

[54] MULTICHANNEL ALIGNMENT SYSTEM

[75] Inventor: Brian P. Gaffney, Medford Lakes, N.J.

[73] Assignee: General Electric Company, Moorestown, N.J.

[21] Appl. No.: 266,757

[22] Filed: Nov. 3, 1988

[51] Int. Cl.$^4$ ............................................. H03D 1/00
[52] U.S. Cl. .................................. 342/151; 342/152; 342/194; 375/94; 329/316; 329/345; 329/341
[58] Field of Search ....................... 342/151, 152, 194; 329/50, 122, 126; 375/94

[56] References Cited

U.S. PATENT DOCUMENTS 3,659,229  4/1972  Milton .
3,703,003  11/1972  Diamond .
3,703,998  2/1974  Pearson, Jr. et al. .
4,438,452  3/1984  Powers .
4,602,273  7/1986  Carlson .
4,773,083  9/1988  Baumbach et al. .
4,779,054  10/1988  Monteleone et al. .

Primary Examiner—Thomas H. Tarcza
Assistant Examiner—Mark Hellner
Attorney, Agent, or Firm—William H. Meise

[57] ABSTRACT

A multichannel processor for signals modulated onto a common IF frequency includes first and second analog-to-digital converters (ADC) for first and second channels, respectively. Each ADC receives a 4XIF frequency clock for producing digital samples, which are applied to a pair of gates for alternately coupling the digital signal to two signal paths. Each signal path alternately negates and does not negate the signals passing therethrough, thereby generating baseband I and Q signals for that channel. Since each channel has a separate ADC, there may be amplitude and temporal error between the channels. One of the channels is selected as a reference, and uses a pair of interpolators to produce samples representing the I and Q signal values at a common time between clock pulses. The other channels include controllable interpolators which are adjusted so that their I, Q common times correspond to that of the reference channel. In one embodiment, the processing is done in a monopulse radar system, and the sum channel is selected as reference.

6 Claims, 6 Drawing Sheets

MULTICHANNEL ALIGNMENT SYSTEM

BACKGROUND OF THE INVENTION

This invention relates to systems for the down conversion of analog signals for generating digital I and Q signals in multiple channels which are aligned in amplitude and in time.

Modern radar systems use monopulse techniques in which signals received by an antenna are processed by addition and subtraction to produce signals in multiple channels which are further processed to determine the range and location of targets. For example, a monopulse system may produce intermediate-frequency sum and difference signals at the antenna processor in response to returns received from the target. The sum and difference signals, together with other signals, are downconverted and digitized for further processing. It is well known that the analog components such as antennas, transmission lines, couplers, filters, and the like may have phase and amplitude differences. The analog processing which produces the sum and difference signals, as well as other signals, may therefore have differential phases or attenuations which result in analog signals which do not correctly represent the signals incident upon the antenna. These errors may be reduced by proper alignment.

In order to perform further processing on the analog intermediate-frequency (IF) sum ($\Sigma$), alpha difference ($\alpha\Delta$), beta difference ($\beta\Delta$), and sidelobe (SL) signals, the signals must be downconverted to baseband. Each of the analog signals is normally downconverted to baseband by a pair of mixers, which receive as local oscillator signals a pair of mutually quadrature sinusoids at the IF frequency, so that one mixer of the pair produces an in-phase (I) signal and the other produces a quadrature (Q) signal. Thus, at least eight mixers are required to downconvert four analog signals to baseband. For further processing, the signals must be in digital form, and as a consequence eight analog-to-digital converters (ADC) are used. Naturally, if there are more than four signals to be processed, additional mixer pairs and ADC's are required. Each ADC performs a sample-and-hold function, followed by quantization and digital conversion.

Correct processing of the sum, $\alpha$ difference, $\beta$ difference, and sidelobe signals depends upon knowledge of their relative amplitudes and relative times of arrival. Those skilled in the art know that mixers are subject to amplitude and phase errors when downconverting, due to differences in the capacitance and forward resistances of the diodes used. The filters used in conjunction with a downconverter may have slight differences in alignment which result in group delay (time) differences. Furthermore, analog-to-digital converters are subject to time jitter attributable to the sample-and-hold function, and also suffer from nonlinearity in conversion. These problems are exacerbated by the fact that the time and amplitude errors are often temperature-dependent. This results in a situation in which the I and Q components of each digitized signal may not have amplitudes which correctly represent their relationship to the Q and I components, respectively, of the source signal. Furthermore, the digitized value of a sample may represent the magnitude of the signal being downconverted and digitized at a time which is not precisely correct; as for example a sequence of samples may actually represent the value of the analog signal as if it were sampled at 2°, 89°, 181°, 268°, 2° rather than 0°, 90°, 180°, 270°, 0°. These errors in the downconversion of any one analog signal make it difficult to accurately assess the magnitude of the signal at any moment. The problem becomes acute when several such signals must be mutually compared, as with monopulse processing. The errors in processing each separate signal may result in much larger errors in the processing of the signals in combination. For example, the difference between two large numbers may exhibit large percentage errors even if the percentage error of each large signal is small.

For these reasons, it is desirable to reduce the errors occurring in the downconversion and analog-to-digital conversion of multiple channels of signals.

SUMMARY OF THE INVENTION

An apparatus for time aligning digital signals derived from first and second analog signals flowing in first and second channels, each modulated onto a carrier, includes a clock signal generator for generating a recurrent sequence of first, second, third and fourth clock pulses, with a rate or frequency four times the carrier rate or frequency. First and second ADCs are coupled to the first and second channels for converting the first and second analog signals to digital form at the clock frequency. Gating circuits are coupled to the ADCs for gating the digitized signals in response to first and third clock pulses of each sequence of clock pulses to produce first and second I signals, and for gating the digitized signals in response to the second and fourth pulses of each sequence to produce Q signals. This produces I and Q signals which occur on different pulses of the sequences. A multiplier associated with each I and Q signal inverts or negates its signal on one pulse of the sequence selected to simulate the effects of downconversion with mutually quadrature local oscillator signals, and the alternated signals so produced are interpolated forward and backward in time as appropriate to produce simultaneous samples representing the magnitude of the I and Q samples at a common time. A control circuit adjusts the common time which the interpolated signals represent so that at least two of the channels have common times. In a particular embodiment of the invention, one of the I, Q interpolator sets makes a fixed or reference interpolation by an amount of one-half a clock cycle, and at least one other I, Q interpolator set is controllable. In at least one embodiment, the amplitude of the digital signals is also aligned.

DESCRIPTION OF THE INVENTION

Figure 1:
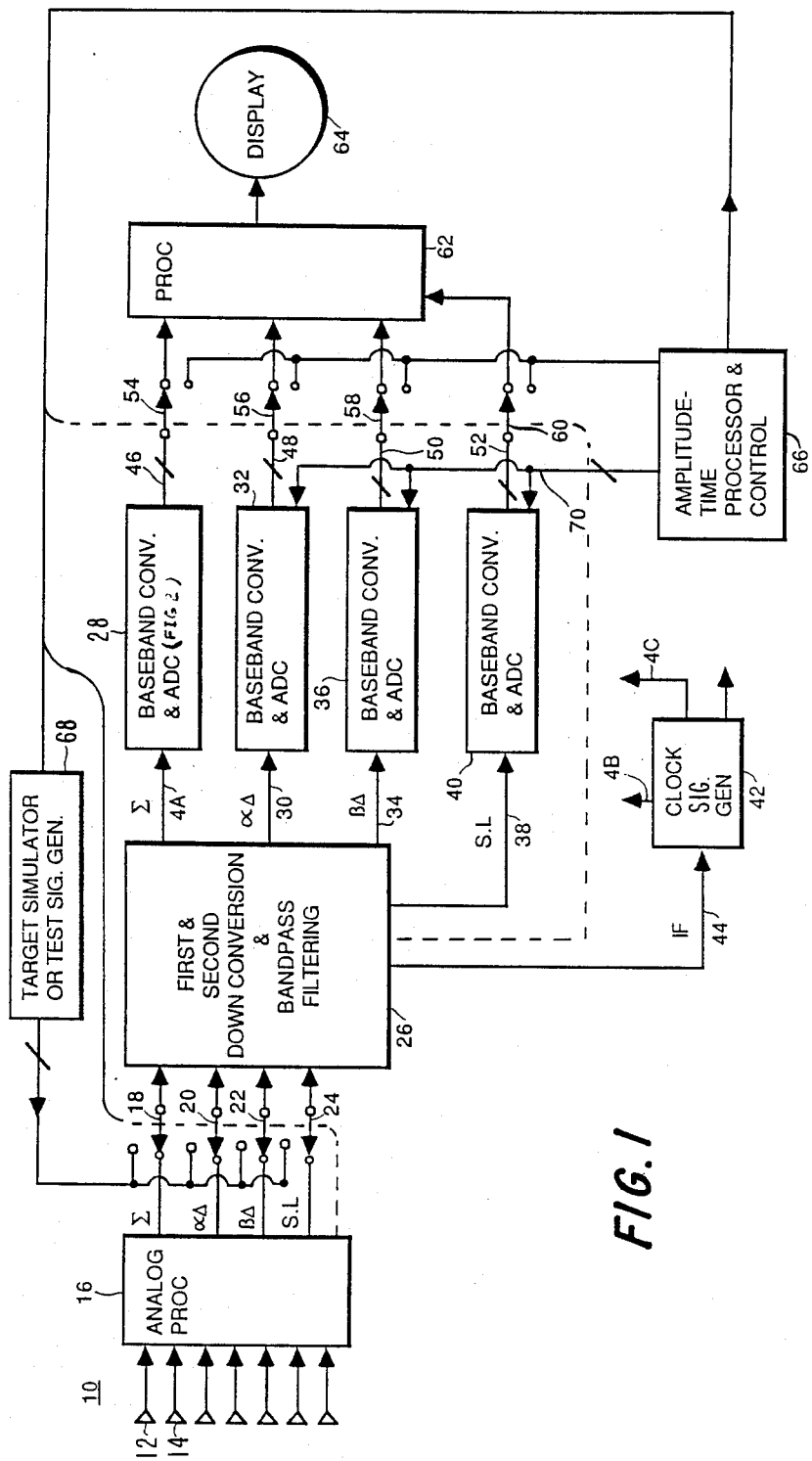
FIG. 1 is a simplified block diagram of a monopulse radar receiver embodying the invention.

FIG. 1 is a simplified block diagram of a monopulse radar receiver in accordance with the invention. In FIG. 1, an array antenna designated generally as 10 includes a plurality of individual antennas 12, 14 .... The signals from the individual antennas such as 12, 14 of array antenna 10 are applied to a system of analog processing illustrated as a block 16. Block 16 includes analog summing (adding) ad differencing (subtracting) circuits and possibly other circuits for generating analog sum ($\Sigma$), two orthogonal difference signals ($\alpha\Delta,\beta\Delta$), sidelobe (SL) signals and such other signals as may be desired. The $\Sigma$, $\alpha\Delta$, $\beta\Delta$, and SL signals are applied by way of switches 18, 20, 22 and 24, respectively, to first and second downconversion circuits and bandpass filtering illustrated together as a block 26. Downconversion and filtering circuit 26 downconverts the $\Sigma$, $\alpha\Delta$, $\beta\Delta$, and SL signals to a common intermediate frequency (IF). The $\Sigma$ signal modulated onto IF is applied over conductor 4A to an analog-to-digital converter (ADC) and baseband converter 28. The $\alpha\Delta$ signal is applied over a conductor 30 to a further ADC and baseband converter 32, the $\beta\Delta$ signal is applied over a conductor 34 to an ADC and baseband converter 36, and the SL signal is applied over a conductor 38 to an ADC and baseband converter 40.

ADC and baseband converter circuits 28, 32, 36 and 40 respond to clock signals received over conductors 4B and 4C derived from a clock signal generator 42. Clock signal generator 42 synchronizes the clock signals to an IF carrier signal received from analog processing block 26 over a conductor 44. ADC and baseband converter circuits 28, 32, 36 and 40 produce on their output conductor sets 46, 48, 50 and 52, respectively, digital signals which ideally represent the in-phase (I) and quadrature (Q) components of the corresponding baseband signals. In order to represent the I and Q components of one baseband signal by 256 quantizing levels, each of the components must be represented by 8 bits, and consequently a total of 16 conductors are in conductor set 46. Conductor sets 48, 50 and 52 may have similar numbers of conductors. The signals on conductor sets 46, 48, 50 and 52 are applied to further signal processing illustrated as a block 62 by a set of switches 54, 56, 58 and 60, respectively. Processing block 62 represents the processing of the radar receiver required to generate signals for display, which signals are applied to a display illustrated as 64. Switches 18, 20, 22 and 24 are controlled together by an amplitude-time processor and control circuit illustrated as a block 66. Similarly, switches 54, 56, 58 and 60 are controlled in synchronism with switches 18-24. The illustrated positions of switches 18-24 and 54-60 are those providing normal signal processing of target returns. In normal signal processing, target returns from antenna 10 are applied to downconversion and filtering block 26, and the digital signals from converters 28, 32, 31 and 40 are applied to processing block 62 to produce signals for display.

In the alternate position of switches 18-24 and 54-60, a signal generator 68 generates signals which are applied to downconversion and filtering block 26 instead of normal target returns, and the outputs of ADC and baseband converter blocks 28, 32, 36 and 40 are applied to amplitude-time processor and control circuit 66. Signal generator 68 may produce one or more test signals such as a sinusoid or a swept-frequency signal simulating the transmitter pulse. Downconversion block 26 produces the appropriate Z, $\Sigma$, $\alpha\Delta$, $\beta\Delta$ and SL signals. With switches 18-24 in their alternate positions (not illustrated), a set of test signals applied from signal generator 68 is simultaneously downconverted and bandpass filtered by block 26 within the accuracy in amplitude and phase or time of which it is capable.

Whether the signal source is antenna 10 or signal generator 68, down-converted $\Sigma$, $\alpha\Delta$, $\beta\Delta$, and SL signals with some time and amplitude errors are generated on conductors 4A, 30, 34 and 38, respectively, and are applied to their corresponding ADC and baseband converters 28, 32, 36 and 40. In response to processing by the ADC and baseband converter, digital signals appear on output conductors 46, 48, 50 and 52 in synchronism with the clock signals produced by clock generator 42. Due to the temporal and amplitude errors introduced by block 26, and also due to the further amplitude and time errors introduced in the various analog-to-digital converters 28, 32, 36 and 40 as between themselves, the digital signals appearing on conductors 46, 48, 50 and 52 may have amplitudes which do not correctly represent the desired relationship between the $\Sigma$, $\alpha\Delta$, $\beta\Delta$ and SL signals. Furthermore, because the ADCs have time jitter, the output signals even though they occur simultaneously may represent the amplitudes of the input signals at times other than the clock time. Such time errors are manifested as additional amplitude errors. The result of these errors in the downconversion and conversion into digital form are such that, if not corrected, the displayed target location or range might be in error.

Figure 2:
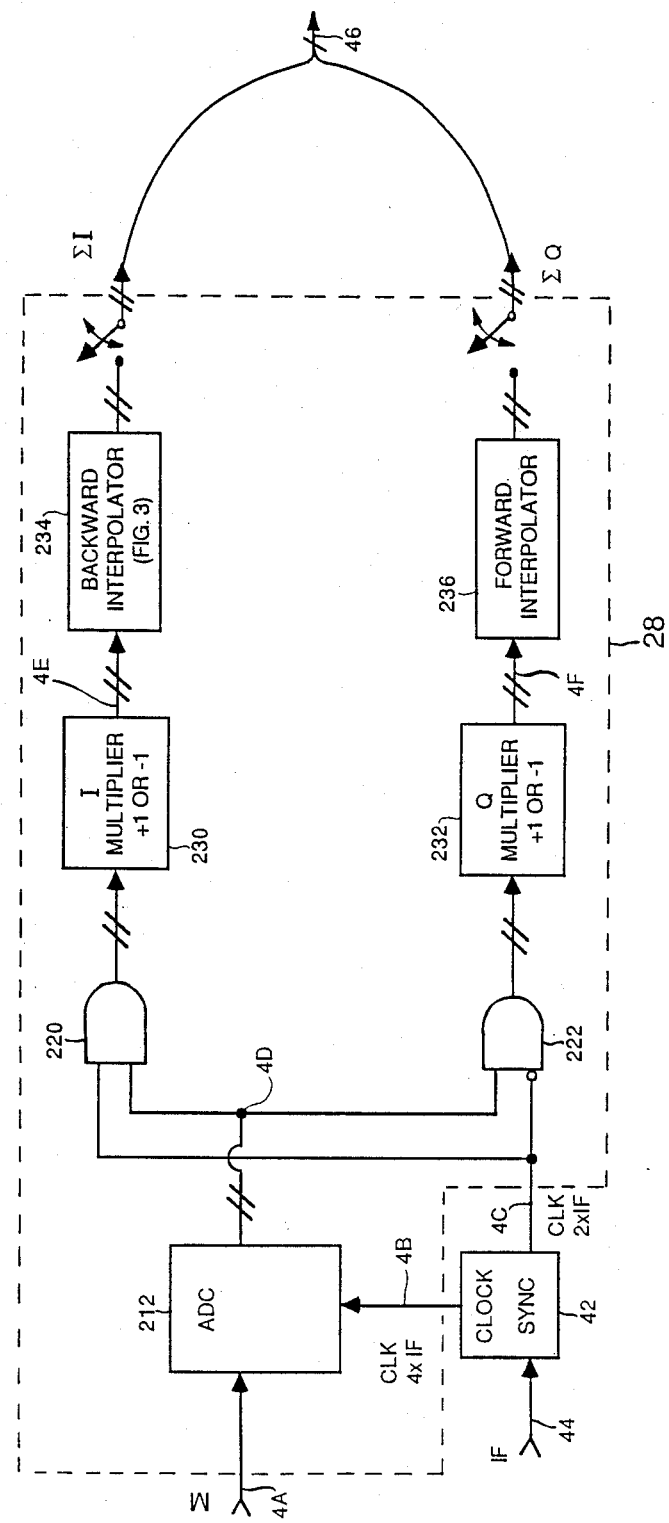
FIG. 2 is a simplified block diagram of an ADC and baseband converter usable in the arrangement of FIG. 1.
Figure 4:
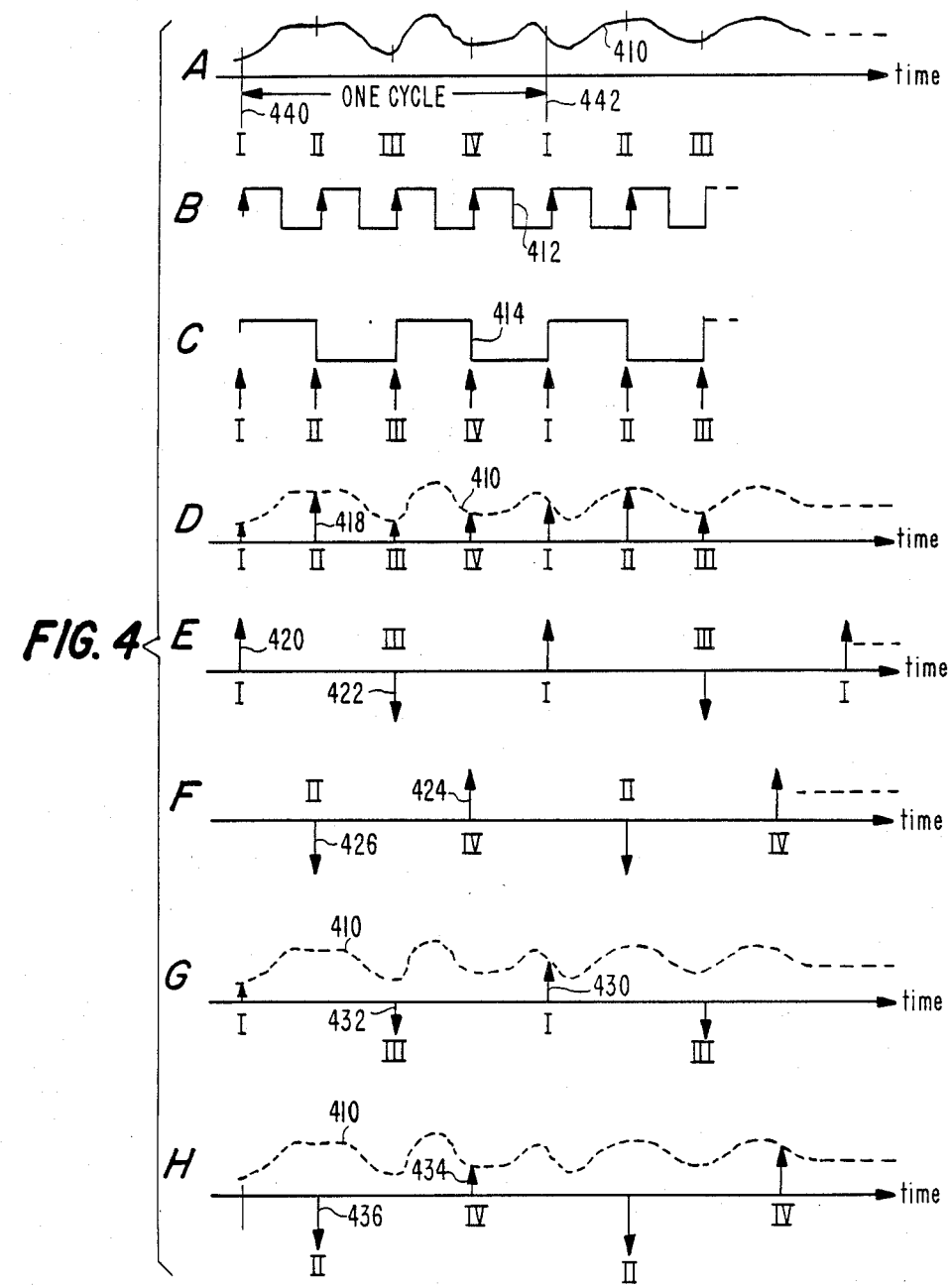
FIGS. 4A–4H are timing diagrams representing voltages, currents and/or operating states of the arrangement of FIG. 2.

FIG. 2 illustrates in simplified block diagram form some details of ADC and baseband converter 28 of FIG. 1. Elements of FIG. 2 corresponding to those of FIG. 1 are designated by the same reference numerals. In FIG. 2, the analog sum signal is applied over conductor 4A to an analog-to-digital converter (ADC) 212. The analog sum signal is illustrated as 410 of FIG. 4A. ADC 212 also receives a 4-times-IF (4XIF) frequency clock signal applied over a conductor 4B. The 4XIF clock signal is illustrated as 412 of FIG. 4B, in the form of recurrent sets of four clock pulses designated I, II, III, and IV. ADC 212 on each positive-going transition of clock waveform 414 of FIG. 4B performs a sample-and-hold operation, quantizes and converts the analog signal into a digital signal in the form of a plurality of simultaneous logic levels appearing on a conductor 4D. Reference to FIG. 4D illustrates the signal appearing on conductor 4D as a result of operation of ADC 212. In FIG. 4D, arrows such as 418 represent the magnitude of the digital signal produced in response to analog signal 410 and the particular clock pulse. The signal on conductor set 4D is applied to inputs of AND gates 220 and 222 (FIG. 2) for being gated thereby. AND gates 220 and 222 receive at their noninverting and inverting inputs, respectively, from a conductor 4C a two-times-IF (2XIF) frequency clock signal illustrated as 414 of FIG. 4C.

In FIG. 4A, times 440 and 442 represent the starting and ending times, respectively, of one cycle of intermediate-frequency carrier. Comparison of FIG. 4A with FIG. 4B shows that four full cycles of 4XIF clock signal 412 occur in the interval required for one cycle of IF signal. Thus, the 4XIF clock signal may be thought of as recurrent sets of 4 clock pulses or cycles per set. For example, the first positive-going clock pulse of FIG. 4B is designated I, the second is designated II, and the third and fourth III and IV, respectively, followed by another set I, II, III . . .

During the interval I-II of 2XIF clock signal 414 of FIG. 4C, AND gate 220 of FIG. 2 is enabled, while AND gate 222 is disabled. In the interval II—III, on the other hand, clock signal 414 of FIG. 4C is at a logic low level, thereby disabling AND gate 220 and enabling AND gate 222. Consequently, the digital signal on conductor 4D applied to gates 220 and 222 from ADC 212 is gated through by gate 220 in the times following clock pulses I and III, and not in the times following clock pulses II and IV. AND gate 222, on the other hand, gates the digital signal during the time following clock pulses II and IV, and not following I and III. The digital signal is therefore gated on alternate clock pulses to a I multiplier 230 and a Q multiplier 232.

Multiplier 230 receives signal during each I and III clock pulse of the four-pulse set, passes the digital signal through unchanged or uninverted on the I clock pulse, and negates or inverts the digital signal, which is equivalent to multiplying the digital signal by −1 or by a negative constant during each III clock pulse. Q multiplier 232 receives a digital signal represented by pulses 418 of FIG. 4D during each II and IV clock pulse. Multiplier 232 passes through the digital signal received during the IV clock pulse uninverted, and negates or inverts the digital signal received during the II clock pulse. These inversions on alternate clock cycles correspond to the operations which would have been performed by downconversions with mutually quadrature cosinusoidal and sinusoidal signals, in which the amplitude of the cosinusoid has amplitude 1, 0, −1, 0 at sequential quarter-cycle points, and the sinusoid has corresponding amplitudes 0, 1, 0, −1. The combined effect of gate 220 and multiplier 230 of FIG. 2 is illustrated in FIG. 4E by upwardly-directed (positive) arrows 420 at the I clock pulse and downwardly-directed (negative) arrows 422 occurring at the III clock pulses, together with zero amplitude at the II and IV clock pulses. The combined effect of gate 222 and multiplier 232 of FIG. 2 is illustrated in FIG. 4F by downwardly-directed arrows 426 at the II clock pulse and upwardly-directed arrows 424 occurring during the IV clock pulses, together with zero amplitude at the I and III clock pulses. The effect of the multiplications is illustrated in FIGS. 4G and 4H. The digital signal samples represented by arrows 430 and 432 of FIG. 4G represents the multiplication of the digital signal represented by arrow 418 of FIG. 4D by the gated and alternately negated signal 420, 422 of FIG. 4E. The effect of multiplying the digital signal represented by arrows 418 of FIG. 4D by the gated and alternately negated function provided by gates 222 and multiplier 232 is illustrated by arrows 434 and 436 of FIG. 4H.

Figure 5:
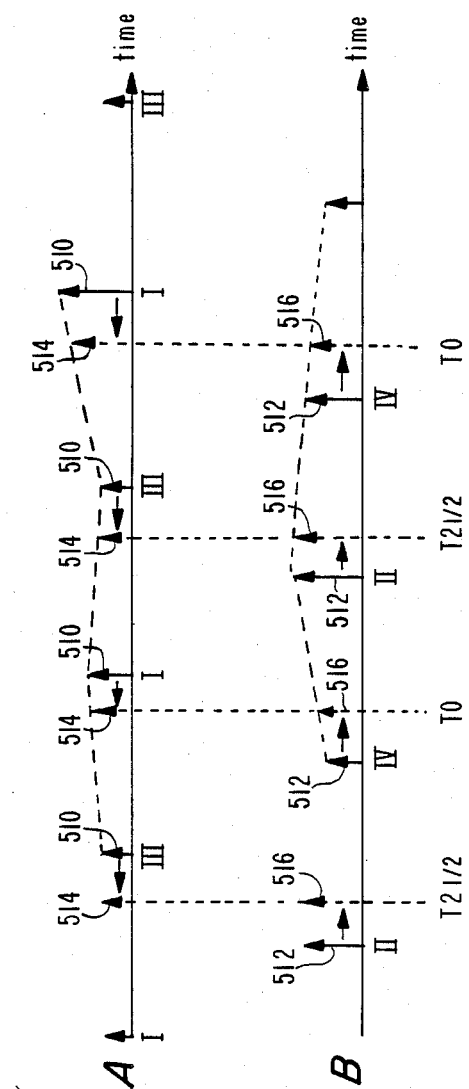
FIG. 5 is a timing diagram illustrating the operation of the interpolator of FIG. 4.

As illustrated by FIGS. 4G and 4H, two I samples occur during each four-clock-pulse cycle in the I channel, and similarly FIG. 4H shows that two samples occur in the Q channel during each four-clock-pulse cycle. The samples representing the I and Q signals, however, do not occur during the same clock pulses. For some purposes it may be desirable to have the I and Q signals representing the same moment relative to the clock pulses. For this purpose, the arrangement of FIG. 2 includes backward interpolator 234 and forward interpolator 236. Backward interpolator 234 interpolates backward in time by one-eighth IF cycle, which corresponds to one-half of the 4XIF clock signal. FIG. 5A illustrates a time line representing the I digital signal occurring during the I and III clocks which is applied to backward interpolator 234. In FIG. 5a, the digital samples are illustrated as solid arrows 510. FIG. 5B is a time line illustrating as solid arrows 512 the digital signals applied to forward interpolator 236 during clock pulses II, IV. A common time lying between the I clock pulse and the IV clock pulse of the preceding sequence of clock pulses is represented in FIG. 5A by a time T0. A common time lying between the II and III clock pulses is illustrated as time T 2½. Backward interpolator 234 of FIG. 2 interpolates the digital signal applied to its input at times I and III back in time by ½ clock pulse to times T0 and T 2½, respectively, as illustrated by dotted-line arrows 514 of FIG. 5A. Forward interpolator 236 of FIG. 2 interpolates the digital signals 51 (FIG. 5B) applied to its input during clock pulses II, IV forward in time to times T0 and T 2½, respectively, as illustrated by dotted-line arrows 516 of FIG. 5B.

It should be emphasized that interpolators 234 and 236 do not actually generate outputs at times T0 and T 2½, but generate outputs at clock pulses I, III and II, IV, respectively. Instead, interpolators 234 and 236 adjust the magnitude of the digital signal which they produce during their respective clock pulses to represent the magnitude they would have had had they been produced at a common time. This is accomplished by interpolation between samples. For example, backward interpolator 234 receives a digital signal illustrated as 510 at clock time I. Interpolator 234 examines time-adjacent signals and performs an interpolation to determine the magnitude of a signal which would have been present at time T0. A linear interpolation is performed by examining only the previously applied digital signal from the previous III clock pulse, and comparing it with the signal currently received as the I clock pulse. Similarly, backward interpolator 234 compares the digital signal 510 received at the III clock pulse with other surrounding digital signals to perform an interpolation. As illustrated in FIG. 5A, a signal 514 is produced at times T 2½ which has an amplitude which is the linear interpolation between the amplitudes of the adjacent signals 510 occurring at times I and III. Forward interpolator 236 of FIG. 2 for each digital signal 512 received during a II clock pulse compares that signal with the signal received during the following IV clock pulse and performs an interpolation to produce signal 516 at time T 2½. The digital signal 512 received by forward interpolator 236 at time IV is compared with the digital signal received during the next following II clock pulse, and interpolated to produce the signal at time T0. Many other types of interpolation can be used other than linear interpolation, as described for example in U.S. Pat. No. 4,438,452 issued Mar. 20, 1984 to Powers.

Figure 3:
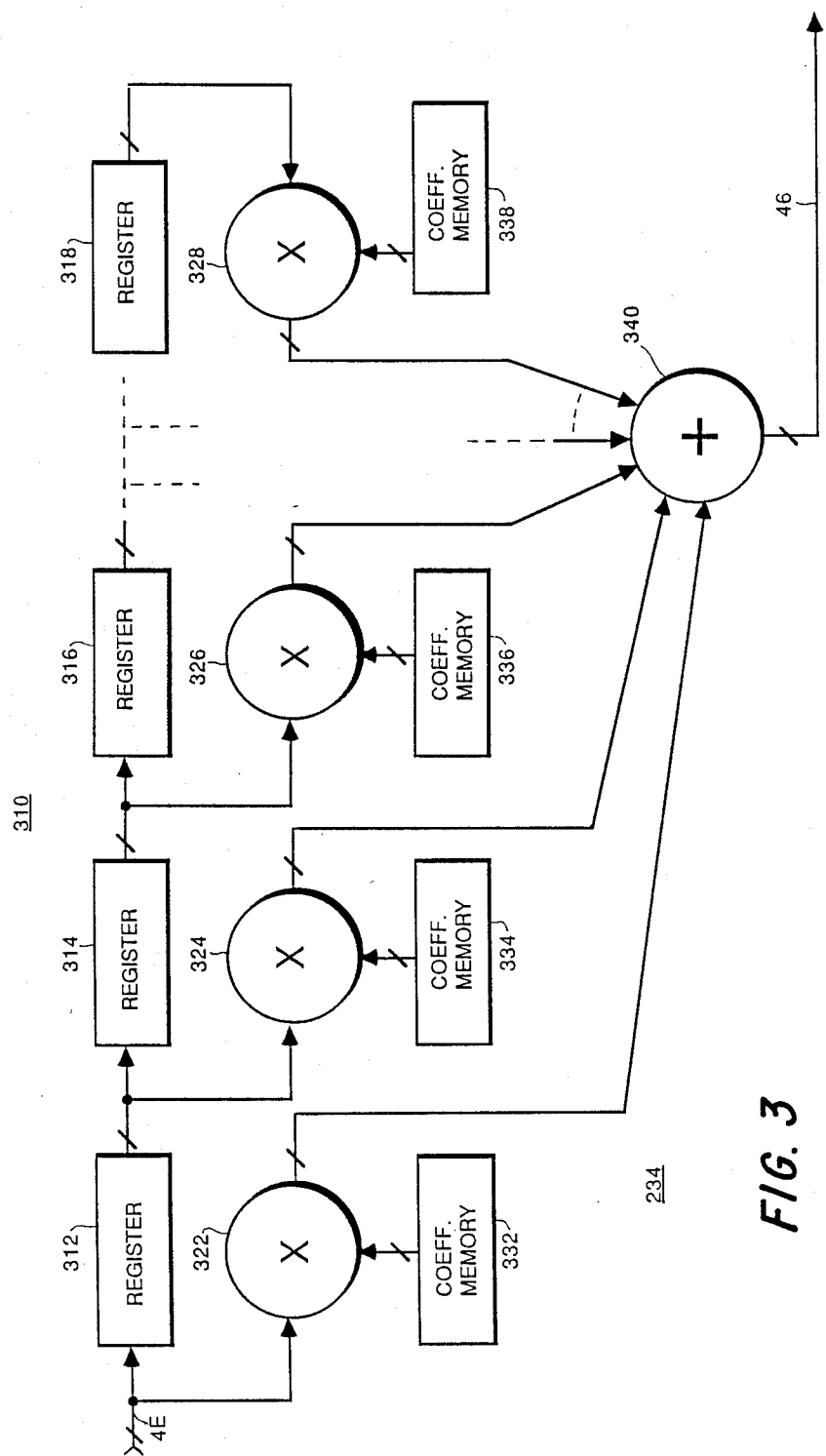
FIG. 3 is a simplified block diagram of one form of interpolator which can be used in the arrangement of FIG. 2.

FIG. 3 illustrates a transversal filter or interpolator which can be used for one of the interpolators in baseband converter 28 in the arrangement of FIG. 1. Elements of FIG. 3 corresponding to those of FIG. 2 are designated by the same reference numerals. In FIG. 3, digital signals are applied over conductor 4E to a digital delay line designated generally as 310 and formed from a cascade of registers 312, 314, 316 . . . 318. The inputs and outputs of the registers represent the digital signal at different times. These signals are applied to a set of multipliers illustrated as 322, 324, 326 . . . 328. Each multiplier 322 . . . 328 is associated with and receives from a coefficient memory 332, 334, 336 . . . 338 a digital signal representing a coefficient by which the digital signal currently applied to the multiplier is multiplied.

The multiplied signals from multipliers 322 ... 328 are applied as inputs to a summing circuit illustrated as 340. The output of summing circuit 340 is the desired interpolated signal. Forward interpolator 236 of ADC and baseband converter 28 of FIG. 1 is identical to the arrangement of FIG. 3, but the coefficients stored in memories 332 ... 338 are selected to provide forward rather than backward interpolation.

As so far described, the arrangement corresponds to that described in U.S. patent application Ser. No. 085,681 filed Aug. 17, 1987 in the name of Monteleone et al. The Monteleone arrangement improves the time coincidence between the I and Q components of the sum signal because both are derived from the same ADC. Use of the Monteleone arrangement for the ADC and baseband converters in FIG. 1 would improve the time coincidence between the I and Q signals in each of the channels. However, as between channels, the differences between the downconverters and ADCs such as 212 of FIG. 2 might introduce further errors. In accordance with the invention, other ADCs and baseband converters such as 32, 36 and 40 of FIG. 1 are arranged with modified controllable interpolators such as 600 of FIG. 6. Also in accordance with the invention, the arrangement of FIG. 1 further includes control circuits illustrated as amplitude time processor and control circuit 66 for controlling the controllable interpolators such as 600 of FIG. 6.

Figure 6:
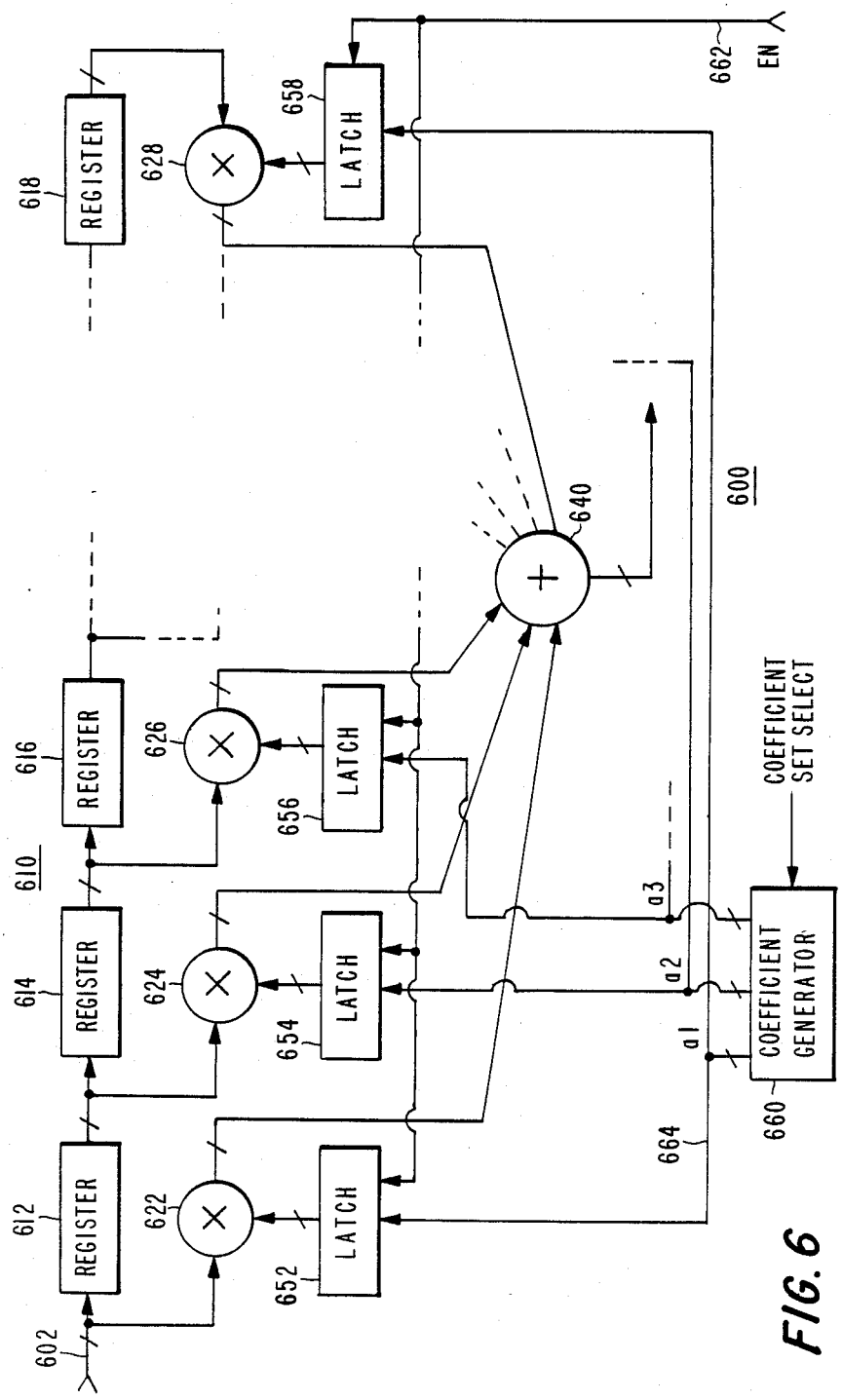
FIG. 6 is a simplified block diagram of an interpolator according to the invention which is usable in the arrangement of FIG. 1.

In FIG. 6, the gated, alternately inverted signal from a multiplier of an ADC and downconverter 32, 36, or 40 is applied over a conductor set 602 to a delay circuit illustrated generally as 610 which includes cascaded registers 612, 614, 616 ... 618. The signals appearing at the inputs and outputs of registers 612 ... 618 are mutually time-delayed samples of the applied signal. The mutually time-delayed samples are applied to inputs of a set of multipliers 622, 624, 626 ... 628. Each multiplier receives a signal from a latch circuit 652, 654, 656 ... 658. Each latch applies to its corresponding multiplier the digital number or word then stored in the latch. The multiplied signal from each of multipliers 622-628 is applied as inputs to a summing circuit 640 which produces the interpolated signal, which may be either forward interpolated or backward interpolated depending upon the values of the coefficients stored in latches 652-658. A coefficient generator illustrated as a block 660 includes multiple outputs $a_1$, $a_2$, $a_3$ which are applied to inputs of latches 652-658. Coefficients $a_1$, $a_2$, $a_3$ ... are latched into latches 652, 654, 656 ... when a predetermined logic level is applied to the latches over a conductor 662. Often, the first multiplier (622) and the last multiplier (628) receive the same coefficient, and therefore the $a_1$ output of generator 660 is applied by way of a conductor 664 to both latches 652 and 658. Similarly, the second and penultimate multiplier often receive the same multiplier such as $a_2$, and therefore the $a_2$ output of coefficient generator 660 is applied to latch 654 and to a corresponding penultimate latch (not illustrated in FIG. 6). Other coefficients may be paired in a similar fashion if desired. Naturally, if there are an odd number of multipliers, there will be a central multiplier which cannot be paired in this fashion. Coefficient generator 660 may simply be a ROM programmed at each address with a plurality of sets of words $a_1$, $a_2$, $a_3$ ... ; $b_1$, $b_2$, $b_3$ ... ; $c_1$, $c_2$, $c_3$ ... , which sets are selectable under the control of addresses applied over a conductor set 661.

As mentioned, ADC and baseband converter 28 of FIG. 1 will include an ADC such as 212 of FIG. 2 which will be different from the corresponding ADC appearing in the other converters such as 32, 36 and 40 of FIG. 1. The time jitter and some of the errors of these ADCs as between themselves (as well as the differences among the preceding analog components) will create differences between the baseband converted and digitized sum, $\alpha\Delta$, $\beta\Delta$, and SL signals, even though for any one of those signals the I and Q components may be stable. These differences may be determined by throwing switches 18, 20, 22, 24; 54, 56, 58 and 60 to their alternate positions. In their alternate positions, the switches direct a test signal from generator 68 in common to analog signal processing block 26, and the resulting signals are applied to ADC and baseband converters 28, 32, 36 and 40 for processing therein. The resulting digitized signals are applied at a common clock time to processor and control circuit 66. Since the input signals are known to be in time correspondence and to be equal in magnitude, it is a relatively simple matter to establish what, if any, time or amplitude errors have occurred in the processing. It is convenient to use the $\Sigma$ signals as a reference and to adjust all the other signals including the $\alpha\Delta$, $\beta\Delta$, and SL signals to match. Depending upon the time and amplitude errors perceived during the test, amplitude-time processor and control circuit 66 sends signals over a bus 70 (FIG. 1) to all the ADC and baseband converters except ADC and baseband converter 28, commanding changes in the interpolator coefficients. ADC and baseband converter 28 may also receive an amplitude-correction signal if appropriate. Each interpolator will in general require a different coefficient set so that several sets may be used, which are individually ordered over a plurality of buses 661 (FIG. 6) contained within bus 70, for changing the interpolation to effectively change the common times so that they correspond to the common times generated by ADC and baseband converter 28 for the $\Sigma$ signal. Thus, time errors in any of baseband converters 32, 36 and 40 which result, in effect, in the common times of their interpolators deviating from that of $\Sigma$ baseband converter and ADC 28 are readjusted to bring their common times into coincidence. Again, it should be noted that the actual I, II, III and IV clock times remain identical for all processors, and what is actually changing is the magnitude of digital signals occurring during the I, II, III and IV clock pulses which represent signals intended to be at times such as T0 and T 2½ of FIG. 5, which are midway between clock pulses. In other words, the errors in timing in ADC and baseband converters 32, 36 and 40 in effect produce digital signals at clock times I, II, III and IV which represent interpolations to times which deviate slightly from times T0 and T 2½, and the corrections to the coefficients of the interpolators move the common times to make them coincide.

The actual nature of the coefficients depends upon the accuracy of the interpolation which is desired as well as other factors, and is selected as described in conjunction with the aforementioned Powers patent and other well known techniques.

Other embodiments of the invention will be apparent to those skilled in the art. For example, switches 18, 20, 22 and 24 of FIG. 1 may be waveguide switches equivalent to single-pole, single throw switches for coupling or decoupling antenna 10 and processor 16 from downconversion and filtering block 26, in which case signal generator 68 may couple signals to block 26 by way of directional couplers. This has the advantage that simulated targets may be superimposed upon actual target returns if desired. While it is considered desirable to select one channel as a reference (the E channel in FIG. 1), any other channel may be considered the reference, but no reference channel need be used, as all the common times can merely be adjusted toward each other rather than adjusting all but one toward that one.

What is claimed is:

1. An apparatus for time aligning digital signals derived from first and second analog signals flowing in first and second channels, respectively, said first and second signals each being modulated onto a carriers which have the same carrier frequency, comprising:

clock signal generating means for generating a recurrent set of sequential first, second, third and fourth clock pulses, the frequency of said clock pulses being at least four times said carrier frequency;

first analog-to-digital converting means coupled to said first channel and to said clock signal generating means for receiving said first analog signal and for converting said first analog signal into a first digital signal at said clock frequency;

second analog-to-digital converting means coupled to said second channel and to said clock signal generating means for receiving said second analog signal and for converting said second analog signal into a second digital signal at said clock frequency;

first gating means coupled to said first analog-to-digital converting means and to said clock signal generating means, said first gating means including an output port, for gating said first digital signal to said output port of said first gating means in response to said first and third pulses of each of said recurrent sets of clock pulses, and for inhibiting gating of said first digital signal to said output port of said first gating means in response to said second and fourth pulses of each of said recurrent sets of clock pulses, for thereby generating a first in-phase digital signal in said first channel;

second gating means coupled to said first analog-to-digital converting means and to said clock signal generating means, said second gating means including an output port, for gating said first digital signal to said output port of said second gating means in response to said second and fourth pulses of each of said recurrent sets of clock pulses, and for inhibiting gating of said first digital signal to said output port of said second gating means in response to said first and third pulses of each of said recurrent sets of clock pulses, for thereby generating a first quadrature digital signal in said first channel;

third gating means coupled to said second analog-to-digital converting means and to said clock signal generating means, said third gating means including an output port, for gating said second digital signal to said output port of said third gating means in response to said first and third pulses of each of said recurrent sets of clock pulses, and for inhibiting gating of said second digital signal to said output port of said third gating means in response to said second and fourth pulses of each of said recurrent sets of clock pulses, for thereby generating a second in-phase digital signal in said second channel;

fourth gating means coupled to said second analog-to-digital converting means and to said clock signal generating means, said fourth gating means including an output port, for gating said second digital signal to said output port of said fourth gating means in response to said second and fourth pulses of each of said recurrent sets of clock pulses, and for inhibiting gating of said second digital signal to said output port of said fourth gating means in response to said first and third pulses of each of said recurrent sets of clock pulses, for thereby generating a second quadrature digital signal in said second channel;

first multiplying means coupled to said first gating means and to said clock signal generating means for multiplying said samples of said first in-phase digital signal in such a manner that said samples of said first in-phase digital signal gated by said first gating means in response to said first pulses of each of said sets of clock pulses are not inverted, and that said samples of said first in-phase digital signal gated by said first gating means in response to said third pulses of each of said sets of clock pulses are inverted, for thereby producing first in-phase alternated digital signals;

second multiplying means coupled to said second gating means and to said clock signal generating means for multiplying said samples of said first quadrature digital signal in such a manner that said samples of said first quadrature digital signal gated by said second gating means in response to said second pulses of each of said sets of clock pulses are inverted, and that said samples of said first quadrature digital signal gated by said second gating means in response to said fourth clock pulses of each of said sets of clock pulses are not inverted, for thereby producing first quadrature alternated digital signals;

third multiplying means coupled to said third gating means and to said clock signal generating means for multiplying said samples of said second in-phase digital signal in such a manner that said samples of said second in-phase digital signal gated by said third gating means in response to said first pulses of each of said sets of clock pulses are not inverted, and that said samples of said second in-phase digital signal gated by said third gating means in response to said third pulses of each of said sets of clock pulses are inverted, for thereby producing second in-phase alternated digital signals;

fourth multiplying means coupled to said fourth gating means and to said clock signal generating means for multiplying said samples of said second quadrature digital signal in such a manner that said samples of said second quadrature digital signal gated by said fourth gating means in response to said second pulses of each of said sets of clock pulses are inverted, and that said samples of said second quadrature digital signal gated by said fourth gating means in response to said fourth clock pulses of each of said sets of clock pulses are not inverted, for thereby producing second quadrature alternated digital signals;

first interpolating means coupled to said first multiplying means for receiving said first in-phase alternated digital signals and for generating, in response to said first clock pulse of each of said sets of clock pulses, interpolated first in-phase digital signals representing the amplitude of said first in-phase digital signal at a selected first time lying between the times of said first clock pulse of each of said sets of clock pulses and said fourth clock pulse of the preceding ones of said sets of clock pulses, and for generating, in response to said third clock pulse of each of said sets of clock pulses, interpolated first in-phase digital signals representing the amplitude of said first in-phase digital signal at a selected second time lying between the times of said third clock pulse of each of said sets of clock pulses and said second clock pulse of the same set of clock pulses:

second interpolating means coupled to said second multiplying means for receiving said second quadrature alternated digital signals and for generating, in response to said second clock pulse of each of said sets of clock pulses, interpolated first quadrature digital signals representing the amplitude of said first quadrature digital signal at a selected third time lying between said second clock pulse of each of said sets of clock pulses and said third clock pulse of the same set of clock pulses, and for generating, in response to said fourth clock pulse of each of said sets of pulses, interpolated first quadrature digital signals representing the amplitude of said first quadrature digital signal at a selected fourth time lying between said fourth clock pulse of each of said sets of clock pulses and said first clock pulse of the succeeding one of said sets of clock pulses;

controllable third interpolating means coupled to said third multiplying means for receiving said second in-phase alternated digital signals and for generating, in response to said first clock pulse of each of said sets of clock pulses, interpolated second in-phase digital signals representing the amplitude of said second in-phase digital signal at a controllable fifth time lying between the times of said first clock pulse of each of said sets of clock pulses and said fourth clock pulse of the preceding one of said sets of clock pulses, and for generating, in response to said third clock pulse of each of said sets of pulses, interpolated second in-phase digital signals representing the amplitude of said second in-phase digital signal at a controllable sixth time lying between the times of said third clock pulse of each of said sets of clock pulses and said second clock pulse of said same set of clock pulses;

controllable fourth interpolating means coupled to said fourth multiplying means for receiving said second quadrature alternated digital signals and for generating, in response to said second clock pulse of each of said sets of clock pulses, interpolated second quadrature digital signals representing the amplitude of said second quadrature digital signal at a controllable seventh time lying between the times of said second clock pulse of each of said sets of clock pulses and said third clock pulse of said same set of clock pulses, and for generating, in response to said fourth clock pulse of each of said sets of clock pulses, interpolated eighth quadrature digital signal representing the amplitude of said second quadrature digital signal at a controllable eighth time lying between the times of said fourth clock pulse of each of said sets of clock pulses and said first clock pulse of the succeeding one of said sets of clock pulses; and control means coupled to at least said third and fourth interpolating means for controlling said third and fourth interpolating means in such a manner that said controllable fifth time corresponds to said selected first time, said controllable sixth time corresponds to said selected second time, said controllable seventh time corresponds to said selected fourth time, and said controllable eighth time corresponds to said selected third time.

2. An apparatus according to claim 1 wherein;

said selected first time corresponds to said selected third time, whereby said controllable fifth time corresponds with said controllable eighth time; and said selected second time corresponds with said selected fourth time, whereby said controllable sixth time corresponds to said controllable seventh time.

3. A radar receiver, comprising:

an antenna adapted at least for reception of radar signals returned from a target;

analog signal processing means coupled to said antenna for processing said radar signals for generating at least analog sum and difference signals, each of said sum and difference signals being modulated onto a carrier having the same carrier frequency;

test signal generating means for simultaneously generating at least test sum and test difference signals, each being modulated onto a carrier near said carrier frequency;

switch means including at least first and second output ports and also including a first input port coupled to said analog signal processing means and a second input port coupled to said test signal generating means for, in a normal operating mode, coupling said sum and difference signals to said first and second output ports, respectively, and for, in an alignment operating mode, coupling said test sum and test difference signals to said first and second output ports, respectively;

clock signal generating means for generating a recurrent set of sequential first, second, third and fourth clock pulses, the frequency of said clock pulses being at least four times said carrier frequency;

first analog-to-digital converting means coupled to said first output port of said switch means and to said clock signal generating means for receiving said sum signal and for converting said sum signal into a first digital signal at said clock frequency;

second analog-to-digital converting means coupled to said second output port of said switch means and to said clock signal generating means for receiving said difference signal and for converting said difference signal into a second digital signal at said clock frequency;

first gating means coupled to said first analog-to-digital converting means and to said clock signal generating means, said first gating means including an output port, for gating said first digital signal to said output port of said first gating means in response to said first and third pulses of each of said recurrent sets of clock pulses and for inhibiting gating of said first digital signal to said output port of said first gating means in response to said second and fourth pulses of each of said recurrent sets of clock pulses, for thereby generating a first in-phase digital signal in a sum channel;

second gating means coupled to said first analog-to-digital converting means and to said clock signal generating means, said second gating means including an output port, for gating said first digital signal to said output port of said second gating means in response to said second and fourth pulses of each of said recurrent sets of clock pulses, and for inhibiting gating of said first digital signal to said output port of said second gating means in response to said first and third pulses of each of said recurrent sets of clock pulses, for thereby generating a first quadrature digital signal in said sum channel;

third gating means coupled to said second analog-to-digital converting means and to said clock signal generating means, said third gating means including an output port, for gating said second digital signal to said output port of said third gating means in response to said first and third pulses of each of said recurrent sets of clock pulses, and for inhibiting gating of said second digital signal to said output port of said third gating means in response to said second and fourth pulses of each of said recurrent sets of clock pulses, for thereby generating a second in-phase digital signal in a difference channel;

fourth gating means coupled to said second analog-to-digital converting means and to said clock signal generating means, said fourth gating means including an output port, for gating said second digital signal to said output port of said fourth gating means in response to said second and fourth pulses of each of said recurrent sets of clock pulses, and for inhibiting gating of said second digital signal to said output port of said fourth gating means in response to said first and third pulses of each of said recurrent sets of clock pulses, for thereby generating a second quadrature digital signal in said difference channel;

first multiplying means coupled to said first gating means and to said clock signal generating means for multiplying said samples of said first in-phase digital signal in such a manner that said samples of said first in-phase digital signal gated by said first gating means in response to said first pulses of each of said sets of clock pulses are not inverted, and that said samples of said first in-phase digital signal gated by said first gating means in response to said third pulses of each of said sets of clock pulses are inverted, for thereby producing first in-phase alternated digital signals;

second multiplying means coupled to said second gating means and to said clock signal generating means for multiplying said samples of said first quadrature digital signal in such a manner that said samples of said first quadrature digital signal gated by said second gating means in response to said second pulses of each of said sets of clock pulses are inverted, and that said samples of said first quadrature digital signal gated by said second gating means in response to said fourth clock pulses of each of said sets of clock pulses are not inverted, for thereby producing first quadrature alternated digital signals;

third multiplying means coupled to said third gating means and to said clock signal generating means for multiplying said samples of said second in-phase digital signal in such a manner that said samples of said second in-phase digital signal gated by said third gating means in response to said first pulses of each of said sets of clock pulses are not inverted, and that said samples of said second in-phase digital signal gated by said third gating means in response to said third pulses of each of said sets of clock pulses are inverted, for thereby producing second in-phase alternated digital signals;

fourth multiplying means coupled to said fourth gating means and to said clock signal generating means for multiplying said samples of said second quadrature digital signal in such a manner that said samples of said second quadrature digital signal gated by said fourth gating means in response to said second pulses of each of said sets of clock pulses are inverted, and that said samples of said second quadrature digital signal gated by said fourth gating means in response to said fourth clock pulses of each of said sets of clock pulses are not inverted, for thereby producing second quadrature alternated digital signals;

first interpolating means coupled to said first multiplying means for receiving said first in-phase alternated digital signals and for generating, in response to said first clock pulse of each of said sets of clock pulses, interpolated first in-phase digital signals representing the amplitude of said first in-phase digital signal at a selected first time lying between the times of said first clock pulse of each of said sets of clock pulses and said fourth clock pulse of the preceding ones of said sets of clock pulses, and for generating, in response to said third clock pulse of each of said sets of clock pulses, interpolated first in-phase digital signals representing the amplitude of said first in-phase digital signal at a selected second time lying between the times of said third clock pulse of each of said sets of clock pulses and said second clock pulse of the same set of clock pulses;

second interpolating means coupled to said second multiplying means for receiving said second quadrature alternated digital signals and for generating, in response to said second clock pulse of each of said sets of clock pulses, interpolated first quadrature digital signals representing the amplitude of said first quadrature digital signal at a selected third time lying between said second clock pulse of each of said sets of clock pulses and said third clock pulse of the same set of clock pulses, and for generating, in response to said fourth clock pulse of each of said sets of pulses, interpolated first quadrature digital signals representing the amplitude of said first quadrature digital signal at a selected fourth time lying between said fourth clock pulse of each of said sets of clock pulses and said first clock pulse of the succeeding one of said sets of clock pulses;

controllable third interpolating means coupled to said third multiplying means for receiving said second in-phase alternated digital signals and for generating, in response to said first clock pulse of each of said sets of clock pulses, interpolated second in-phase digital signals representing the amplitude of said second in-phase digital signal at a controllable fifth time lying between the times of said first clock pulse of each of said sets of clock pulses and said fourth clock pulse of the preceding one of said sets of clock pulses, and for generating, in response to said third clock pulse of each of said sets of pulses, interpolated second in-phase digital signals representing the amplitude of said second in-phase digital signal at a controllable sixth time lying between the times of said third clock pulse of each of said sets of clock pulses and said second clock pulse of said same set of clock pulses;

controllable fourth interpolating means coupled to said fourth multiplying means for receiving said second quadrature alternated digital signals and for generating, in response to said second clock pulse of each of said sets of clock pulses, interpolated second quadrature digital signals representing the amplitude of said second quadrature digital signal at a controllable seventh time lying between the times of said second clock pulse of each of said sets of clock pulses and said third clock pulse of said same set of clock pulses, and for generating, in response to said fourth clock pulse of each of said sets of clock pulses, interpolated eighth quadrature digital signal representing the amplitude of said second quadrature digital signal at a controllable eighth time lying between the times of said fourth clock pulse of each of said sets of clock pulses and said first clock pulse of the succeeding one of said sets of clock pulses; and control means coupled to at least said third and fourth interpolating means for controlling said third and fourth interpolating means in such a manner that, at least in said alignment operating mode, said controllable fifth time corresponds to said selected first time, said controllable sixth time corresponds to said selected second time, said controllable seventh time corresponds to said selected fourth time, and said controllable eighth time corresponds to said selected third time, and in such a manner that said third and fourth interpolating means remain during said normal operating mode in the condition established during said alignment operating mode.

4. An apparatus according to claim 3 wherein;
said selected first time corresponds to said selected third time, whereby said controllable fifth time corresponds with said controllable eighth time; and
said selected second time corresponds with said selected fourth time, whereby said controllable sixth time corresponds to said controllable seventh time.

5. A method for time aligning digital signals derived from first and second analog signals flowing in first and second channels, respectively, said first and second signals each being modulated onto a carrier each of which has the same carrier frequency, said method comprising the steps of:
generating a recurrent set of sequential first, second, third and fourth clock pulses, the frequency of said clock pulses being at least four times said carrier frequency;
converting said first analog signal into a first digital signal at said clock frequency;
converting said second analog signal into a second digital signal at said clock frequency;
gating said first digital signal in response to said first and third pulses of each of said recurrent sets of clock pulses, and inhibiting gating of said first digital signal in response to said second and fourth pulses of each of said recurrent sets of clock pulses, for thereby generating a first in-phase digital signal in said first channel;
gating said first digital signal in response to said second and fourth pulses of each of said recurrent sets of clock pulses, and inhibiting gating of said first digital signal in response to said first and third pulses of each of said recurrent sets of clock pulses, for thereby generating a first quadrature digital signal in said first channel;

gating said second digital signal in response to said first and third pulses of each of said recurrent sets of clock pulses, and inhibiting gating of said second digital signal in response to said second and fourth pulses of each of said recurrent sets of clock pulses, for thereby generating a second in-phase digital signal in said second channel;
gating said second digital signal in response to said second and fourth pulses of each of said recurrent sets of clock pulses, and inhibiting gating of said second digital signal in response to said first and third pulses of each of said recurrent sets of clock pulses, for thereby generating a second quadrature digital signal in said second channel;
multiplying said samples of said first in-phase digital signal in such a manner that said samples of said first in-phase digital signal gated in response to said first pulses of each of said sets of clock pulses are not inverted, and that said samples of said first in-phase digital signal gated in response to said third pulses of each of said sets of clock pulses are inverted, for thereby producing first in-phase alternated digital signals;
multiplying said samples of said first quadrature digital signal in such a manner that said samples of said first quadrature digital signal gated in response to said second pulses of each of said sets of clock pulses are inverted, and that said samples of said first quadrature digital signal gated in response to said fourth clock pulses o each of said sets of clock pulses are not inverted, for thereby producing first quadrature alternated digital signals;
multiplying said samples of said second in-phase digital signal in such a manner that said samples of said second in-phase digital signal gated in response to said first pulses of each of said sets of clock pulses are not inverted, and that said samples of said second in-phase digital signal gated in response to said third pulses of each of said sets of clock pulses are inverted, for thereby producing second in-phase alternated digital signals;
multiplying said samples of said second quadrature digital signal in such a manner that said samples of said second quadrature digital signal gated in response to said second pulses of each of said sets of clock pulses are inverted, and that said samples of said second quadrature digital signal gated in response to said fourth clock pulses of each of said sets of clock pulses are not inverted, for thereby producing second quadrature alternated digital signals;
generating, in response to said first clock pulse of each of said sets of clock pulses, interpolated first in-phase digital signals representing the amplitude of said first in-phase digital signal at a selected first time lying between the times of said first clock pulse of each of said sets of clock pulses and said fourth clock pulse of the preceding ones of said sets of clock pulses;
generating, in response to said third clock pulse of each of said sets of clock pulses, interpolated first in-phase digital signals representing the amplitude of said first in-phase digital signal at a selected second time lying between the times of said third clock pulse of each of said sets of clock pulses and said second clock pulse of the same set of clock pulses;

generating, in response to said second clock pulse of each of said sets of clock pulses, interpolated first quadrature digital signals representing the amplitude of said first quadrature digital signal at a selected third time lying between said second clock pulse of each of said sets of clock pulses and said third clock pulse of the same set of clock pulses;

generating, in response to said fourth clock pulse of each of said sets of pulses, interpolated first quadrature digital signals representing the amplitude of said first quadrature digital signal at a selected fourth time lying between said fourth clock pulse of each of said sets of clock pulses and said first clock pulse of the succeeding one of said sets of clock pulses;

generating, in response to said first clock pulse of each of said sets of clock pulses, interpolated second in-phase digital signals representing the amplitude of said second in-phase digital signal at a controllable fifth time lying between the times of said first clock pulse of each of said sets of clock pulses and said fourth clock pulse of the preceding one of said sets of clock pulses;

generating, in response to said third clock pulse of each of said sets of pulses, interpolated second in-phase digital signals representing the amplitude of said second in-phase digital signal at a controllable sixth time lying between the times of said third clock pulse of each of said sets of clock pulses and said second clock pulse of said same set of clock pulses;

generating, in response to said second clock pulse of each of said sets of clock pulses, interpolated second quadrature digital signals representing the amplitude of said second quadrature digital signal at a controllable seventh time lying between the times of said second clock pulse of each of said sets of clock pulses and said third clock pulse of said same set of clock pulses;

generating, in response to said fourth clock pulse of each of said sets of clock pulses, interpolated eighth quadrature digital signal representing the amplitude of said second quadrature digital signal at a controllable eighth time lying between the ties of said fourth clock pulse of each of said sets of clock pulses and said first clock pulse of the succeeding one of said sets of clock pulses;

controlling said third and fourth interpolating means in such a manner that said controllable fifth time corresponds to said selected first time, said controllable sixth time corresponds to said selected second time, said controllable seventh time corresponds to said selected fourth time, and said controllable eighth time corresponds to said selected third time.

6. A method according to claim 5 wherein;

said selected first time corresponds to said selected third time, whereby said controllable fifth time corresponds with said controllable eighth time; and said selected second time corresponds with said selected fourth time, whereby said controllable sixth time corresponds to said controllable seventh time.

* * * * *